United States Patent
Baek

(10) Patent No.: US 6,200,821 B1
(45) Date of Patent: Mar. 13, 2001

(54) METHOD FOR FABRICATING FERROELECTRIC RANDOM ACCESS MEMORY DEVICE

(75) Inventor: Yong-Ku Baek, Kyoungki-Do (KR)

(73) Assignee: Hyundai Electronics Industries Co. UT (KR)

( * ) Notice: Subject to any disclaimer, the term of this patent is extended or adjusted under 35 U.S.C. 154(b) by 0 days.

(21) Appl. No.: 09/428,626

(22) Filed: Oct. 27, 1999

(30) Foreign Application Priority Data

Oct. 28, 1998 (KR) .................................................. 98-45276

(51) Int. Cl.$^7$ .................................................. H01L 21/00
(52) U.S. Cl. .............................. 438/3; 438/240; 438/643; 438/250
(58) Field of Search .................................. 438/3, 240, 239, 438/250, 253, 393, 396, 643, 648, 649, 682, 683

(56) References Cited

U.S. PATENT DOCUMENTS

| | | |
|---|---|---|
| 5,119,154 | 6/1992 | Gnadinger ............................ 357/23.6 |
| 5,216,572 * | 6/1993 | Larson et al. . |
| 5,273,927 | 12/1993 | Gnadinger . |
| 5,350,705 | 9/1994 | Brassington et al. ................. 257/295 |
| 5,372,971 * | 12/1994 | Kang et al. . |
| 5,475,248 | 12/1995 | Takenaka .............................. 257/295 |
| 5,495,117 | 2/1996 | Larson ................................... 257/295 |
| 5,580,814 | 12/1996 | Larson . |
| 5,591,663 | 1/1997 | Nasu et al. . |
| 5,796,134 | 8/1998 | Kim ...................................... 257/295 |
| 5,838,605 | 11/1998 | Bailey .................................... 365/145 |
| 5,899,740 * | 5/1999 | Kwon . |
| 6,010,927 * | 1/2000 | Jones, Jr. et al. . |

FOREIGN PATENT DOCUMENTS

| | | | |
|---|---|---|---|
| 9-51077 | 2/1997 | (JP) | ............................... H01L/27/10 |
| 9-167796 | 6/1997 | (JP) | ............................. H01L/21/768 |

* cited by examiner

Primary Examiner—Tuan H. Nguyen
(74) Attorney, Agent, or Firm—Blakely Sokoloff Taylor & Zafman

(57) ABSTRACT

A method for fabricating a ferroelectric random access memory device, includes the steps of: forming an interlayer insulating layer on a ferroelectric capacitor and a transistor; forming a first opening through the interlayer insulating layer in order to expose a top electrode of the ferroelectric capacitor; forming the barrier metal layer on the resulting structure on which the first opening is formed, wherein the barrier metal layer is in contact with the top electrode of the ferroelectric capacitor; selectively etching the barrier metal and interlayer insulating layers and forming a second opening in order to expose a junction layer of the transistor; forming a polysilicon layer on the resulting structure and doping impurity ions into the polysilicon layer, wherein the doped polysilicon layer is in contact with the junction layer of the transistor; and selectively etching the polysilicon and barrier metal layers, thereby patterning an interconnection layer for interconnecting the transistor and the ferroelectric capacitor, wherein the capacitor is electrically in contact with the interconnection layer via the barrier metal layer and the transistor is electrically in contact with the interconnection layer.

11 Claims, 3 Drawing Sheets

METHOD FOR FABRICATING FERROELECTRIC RANDOM ACCESS MEMORY DEVICE

FIELD OF THE INVENTION

The present invention relates to a method for fabricating a ferroelectric random access memory (FeRAM); and, more particularly, to a method for fabricating the FeRAM having an interconnection layer for interconnecting a capacitor being in contact with a barrier metal layer and a transistor.

DESCRIPTION OF THE PRIOR ART

A ferroelectric random access memory (FeRAM) is a non-volatile memory to store information without consecutive power supply and studied for a next generation memory device.

In a conventional method for fabricating the FeRAM, aluminum and titanium nitride are used to interconnect a capacitor for storing data and a transistor for switching data input and output. In order to interconnect the capacitor and the transistor, the conventional method uses a metal material, such as aluminum and titanium nitride, as an interconnection material. In a high-temperature process carried out at a temperature of more than 600° C., the metal material as the interconnection material may be melted or conductive characteristics of the metal material may be degraded. Step coverage of the interconnection material may be degraded due to the minimization of a pattern and an aspect ratio of a contact hole increased by high integration. When the metal material is in contact with a junction layer of a transistor, misalignment may be caused. When the distance difference between junction layers is decreased according to the high integration, a junction leakage current may be increased. To address these problems as described above, additional processes such as plug implantation and annealing processes are needed to interconnect the capacitor and the transistor.

Meanwhile, when polysilicon widely used as the interconnection material is employed to interconnect the capacitor and the transistor, the polysilicon reacts with a capacitor electrode material, i.e. platinum, thereby forming platinum (Pt) silicide. At this time, since the characteristics of an electrode of the capacitor are degraded, the characteristics of the capacitor are degraded. Also, since the silicon component of the polysilicon is diffused into a ferroelectric thin film of the electrode of the capacitor, the characteristics of a ferroelectric material may be degraded.

SUMMARY OF THE INVENTION

It is, therefore, an object of the present invention to provide a method for fabricating a ferroelectric random access memory (FeRAM) that is capable of ensuring step coverage of an interconnection material for interconnecting a ferroelectric capacitor and a transistor.

It is another object of the present invention to provide a method for fabricating a ferroelectric random access memory (FeRAM) that is capable of providing a preferred ohmic contact between an interconnection material and a top electrode of a ferroelectric capacitor.

It is further another object of the present invention to provide a method for fabricating a ferroelectric random access memory (FeRAM) that may improve the characteristics of a ferroelectric capacitor.

In accordance with an aspect of the present invention, there is provided a method for fabricating a ferroelectric random access memory device, comprising the steps of: forming an interlayer insulating layer on a ferroelectric capacitor and a transistor; forming a first opening through the interlayer insulating layer in order to expose a top electrode of the ferroelectric capacitor; forming the barrier metal layer on the resulting structure on which the first opening is formed, wherein the barrier metal layer is in contact with the top electrode of the ferroelectric capacitor; selectively etching the barrier metal and interlayer insulating layers and forming a second opening in order to expose a junction layer of the transistor; forming a polysilicon layer on the resulting structure and doping impurity ions into the polysilicon layer, wherein the doped polysilicon layer is in contact with the junction layer of the transistor; and selectively etching the polysilicon and barrier metal layers, thereby patterning an interconnection layer for interconnecting the transistor and the ferroelectric capacitor, wherein the capacitor is electrically in contact with the interconnection layer via the barrier metal layer and the transistor is electrically in contact with the interconnection layer.

BRIEF DESCRIPTION OF THE DRAWINGS

Other objects and aspects of the invention will become apparent from the following description of the embodiment with reference to the accompanying drawings, in which.

DETAILED DESCRIPTION OF THE INVENTION

Hereafter, the present invention will be described in detail with reference to the accompanying drawings.

Figure 1A:
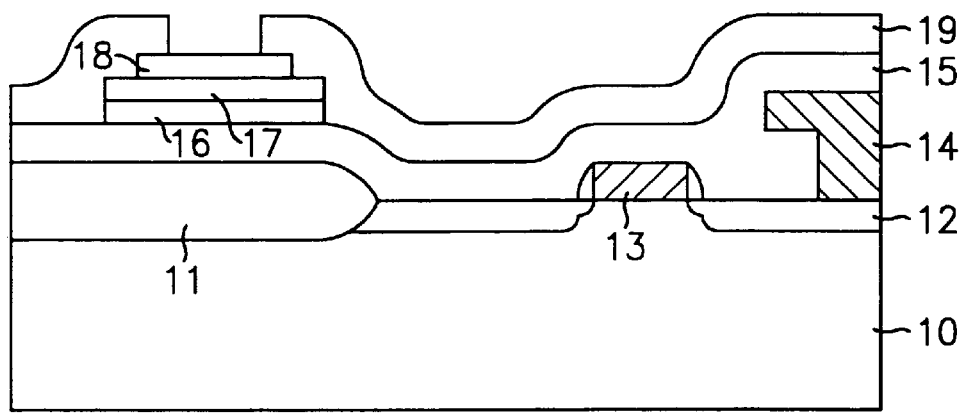
FIGS. 1A to 1E show cross-sectional views illustrating a method for fabricating a ferroelectric random access memory (FeRAM) in accordance with the present invention.

Referring to FIG. 1A, a transistor and a capacitor of the FeRAM are formed on a semiconductor substrate 10 in which a field oxide layer 11 is formed, and an interlayer insulating layer 19 is formed on the resulting structure. After forming the interlayer insulating layer 19, a contact hole is formed by using a selective etching process in order to expose the top electrode of the capacitor, i.e. a platinum layer 18. Reference numerals 12, 13, 14, 15, 16 and 17 refer to a junction layer, a gate, a bit line, the interlayer insulating layer, a bottom electrode of the capacitor and a ferroelectric thin film, respectively.

Figure 1B:
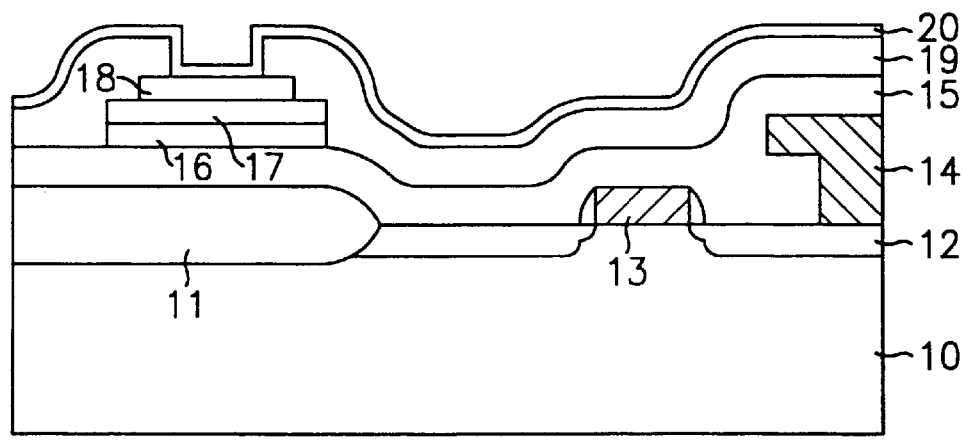

Referring to FIG. 1B, after forming the contact hole, a titanium nitride (TiN) layer 20 as a barrier metal layer is formed on the resulting structure. At this time, the titanium nitride layer 20 has a thickness of 100–2000 Å and the barrier metal layer such as Ti, W, Ta and TaN layers may be used instead of the titanium nitride (TiN) layer 20.

Figure 1C:
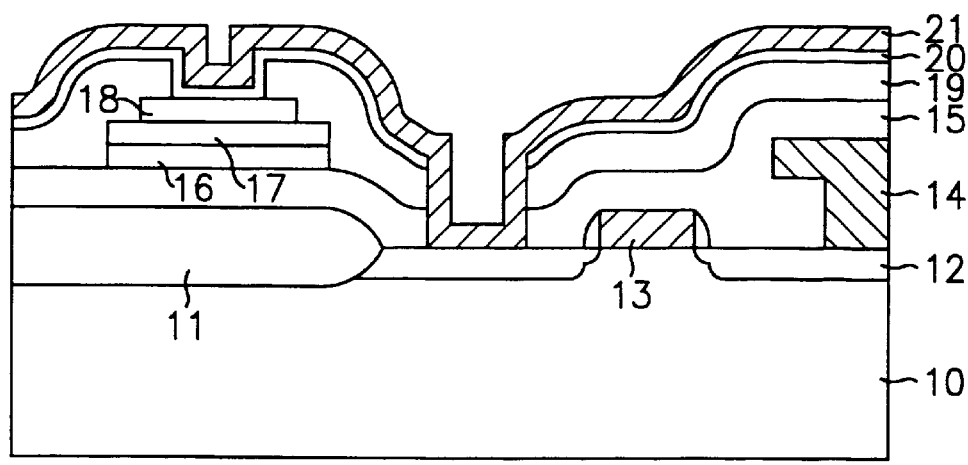

Referring to FIG. 1C, after forming the titanium nitride layer 20, the interlayer insulating layers 19 and 15 are selectively etched and a contact hole is formed in order to expose a junction layer 12 and polysilicon layer 21 of the interconnection material is deposited on the resulting structure. At this time, the polysilicon layer 21 has a thickness of 1000–3000 Å and phosphorus (P), boron (B) and arsenic (As) ions are doped into the polysilicon layer 21 by using an in-situ doping, an ion implantation or a dopant source diffusion. Also, to improve conductive characteristics, the polysilicon layer 21 may be replaced with a silicide layer such as tungsten, titanium and tantalum silicide layers and used together with silicide in a stacked polycide structure of the polysilicon and the silicide.

Figure 1D:
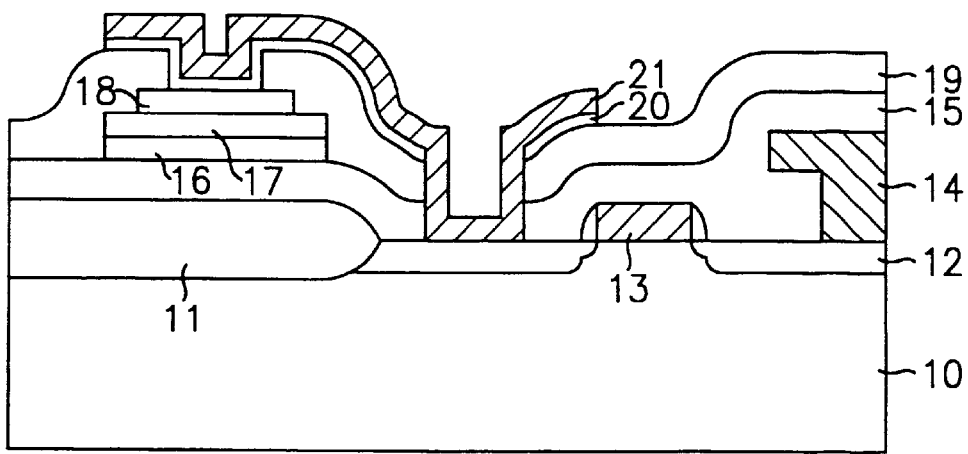

Referring to FIG. 1D, after depositing the polysilicon layer 21, a mask process is carried out. After carrying out the mask process, the polysilicon and titanium nitride layers 21 and 20 are selectively etched. Then, an interconnection layer for interconnecting the ferroelectric capacitor and the transistor is formed.

Figure 1E:
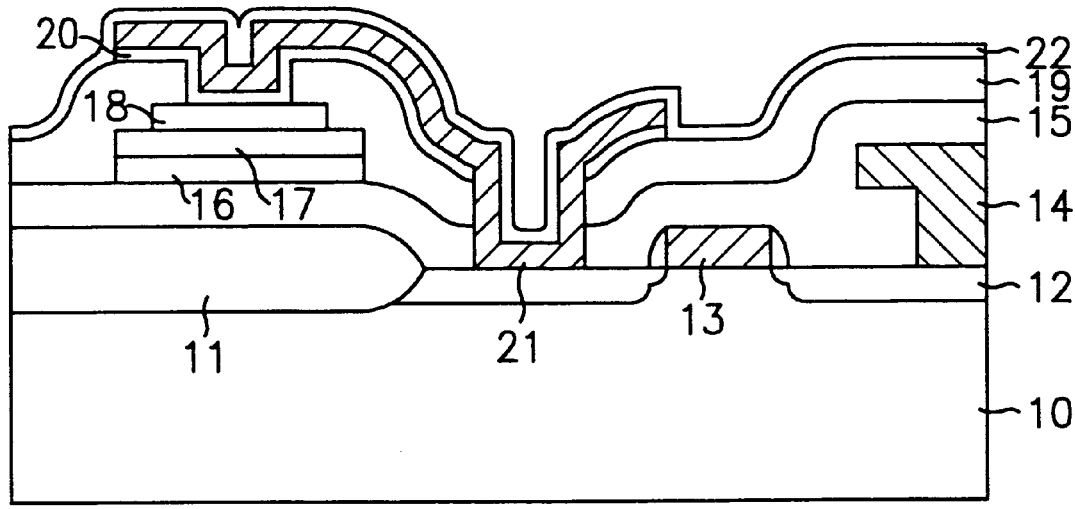

Referring to FIG. 1E, after forming the interconnection layer, a silicon nitride layer 22 is deposited on the resulting structure in order to prevent the titanium nitride layer 20 from being oxidized in a succeeded high-temperature process. After depositing the silicon nitride layer 22, a borophosphosilicate glass (BPSG) layer is deposited on the resulting structure and the BPSG layer is planarized by a BPSG flow process. Although the BPSG flow process is carried out at a temperature of more than 800° C., the barrier metal is not oxidized. Accordingly, a succeeded process may be stabilized.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a ferroelectric random access memory (FeRAM) device, comprising the steps of:

forming an interlayer insulating layer on a ferroelectric capacitor and a transistor;

forming a first opening through the interlayer insulating layer in order to expose a top electrode of the ferroelectric capacitor;

forming a barrier metal layer on the resulting structure on which the first opening is formed, wherein the barrier metal layer is in contact with the top electrode of the ferroelectric capacitor;

selectively etching the barrier metal and interlayer insulating layer and forming a second opening in order to expose a junction layer of the transistor;

forming a polysilicon layer on the resulting structure and doping impurity ions into the polysilicon layer, wherein the doped polysilicon layer is in contact with the junction layer of the transistor; and selectively etching the polysilicon and barrier metal layer, thereby patterning an interconnection layer for interconnecting the transistor and the ferroelectric capacitor, wherein the capacitor is electrically in contact with the interconnection layer via the barrier metal layer and the transistor is electrically in contact with the interconnection layer.

2. The method as recited in claim 1, wherein the impurity ions of the doped polysilicon layer include phosphorus (P), boron (B) and arsenic (As).

3. The method as recited in claim 2, wherein the polysilicon layer is doped by the same type impurity ions as the junction layer of the transistor.

4. The method as recited in claim 1, further comprising the step of forming a refractory metal on the polysilicon layer and reacting the polysilicon layer with the refractory metal to form a silicide layer.

5. The method as recited in claim 4, further comprising the step of forming a first insulating layer for oxidation prevention on the resulting structure having the interconnection layer.

6. The method as recited in claim 5, further comprising the step of forming a second insulating layer for planarization on the first insulating layer for the oxidation prevention.

7. The method as recited in claim 6, wherein the step of forming the second insulating layer further comprises:

forming a borophosphosilicate glass (BPSG) layer on the first insulating layer; and flowing the BPSG layer at a temperature of more than 800° C.

8. The method as recited in claim 4, wherein the step of reacting the polysilicon layer with the refractory metal to form the silicide layer, comprises the steps of:

forming a refractory metal layer on the polysilicon layer; and reacting the polysilicon layer with the refractory metal in a thermal treatment to form the silicide layer.

9. The method as recited in claim 1, wherein the barrier metal layer is selected from TiN, Ti, W, Ta and TaN layers.

10. The method as recited in claim 1, wherein the polysilicon layer has a thickness of 1000–3000 Å.

11. The method as recited in claim 1, wherein the barrier metal layer has a thickness of 100–2000 Å.

* * * * *